US009881908B2

United States Patent
Lin et al.

(12) United States Patent

(10) Patent No.: US 9,881,908 B2

(45) Date of Patent: Jan. 30, 2018

(54) INTEGRATED FAN-OUT PACKAGE ON PACKAGE STRUCTURE AND METHODS OF FORMING SAME

(71) Applicant: Taiwan Semiconductor Manufacturing Company, Ltd., Hsin-Chu (TW)

(72) Inventors: Wen-Yi Lin, New Taipei (TW); Hsien-Wen Liu, Hsin-Chu (TW); Po-Yao Lin, Zhudong Township (TW); Cheng-Lin Huang, Hsin-Chu (TW); Shyue-Ter Leu, Hsin-Chu (TW); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/996,494

(22) Filed: Jan. 15, 2016

(65) Prior Publication Data

US 2017/0207204 A1 Jul. 20, 2017

(51) Int. Cl.

*H01L 23/48* (2006.01)
*H01L 25/10* (2006.01)
*H01L 25/00* (2006.01)

(52) U.S. Cl.

CPC ............ *H01L 25/105* (2013.01); *H01L 25/50* (2013.01); *H01L 2225/1058* (2013.01); *H01L 2225/1094* (2013.01)

(58) Field of Classification Search

CPC .................. H01L 25/50; H01L 25/105; H01L 2225/1058; H01L 2225/06513

USPC .................................................. 257/686, 777

See application file for complete search history.

(56) References Cited

U.S. PATENT DOCUMENTS 6,798,057 B2 * 9/2004 Bolkin .................. H01L 25/105 257/637
7,394,148 B2 * 7/2008 Karnezos ............ H01L 23/3128 257/686
8,310,051 B2 11/2012 Chen et al.
8,361,842 B2 1/2013 Yu et al.
8,546,929 B2 10/2013 Dng et al.
8,680,647 B2 3/2014 Yu et al.
8,703,542 B2 4/2014 Lin et al.
8,759,147 B2 * 6/2014 Choi .................... H01L 21/561 257/678
8,759,964 B2 6/2014 Pu et al.
8,778,738 B1 7/2014 Lin et al.
8,785,299 B2 7/2014 Mao et al.
8,803,306 B1 8/2014 Yu et al.
8,809,996 B2 8/2014 Chen et al.
8,829,676 B2 9/2014 Yu et al.
8,877,554 B2 11/2014 Tsai et al.
9,034,696 B2 * 5/2015 Mohammed ........ H01L 23/3128 257/790

(Continued)

*Primary Examiner* — Nitin Parekh

(74) *Attorney, Agent, or Firm* — Slater Matsil, LLP

(57) ABSTRACT

An embodiment package includes a first package; a thermal interface material (TIM) contacting a top surface of the first package, and a second package bonded to the first package. The second package includes a first semiconductor die, and the TIM contacts a bottom surface of the first semiconductor die. The package further includes a heat spreader disposed on an opposing surface of the second package as the first package.

18 Claims, 10 Drawing Sheets

(56) References Cited

U.S. PATENT DOCUMENTS

2004/0124512 A1* 7/2004 Tao .................... H01L 23/4334 257/678
2007/0007641 A1* 1/2007 Lee ........................ H01L 24/97 257/691
2008/0136004 A1* 6/2008 Yang ...................... H01L 24/96 257/686
2008/0157327 A1* 7/2008 Yang .................... H01L 25/105 257/686
2011/0285007 A1* 11/2011 Chi ........................ H01L 24/96 257/686
2011/0291288 A1 12/2011 Wu et al.
2012/0001306 A1* 1/2012 Wang .................. H01L 21/4832 257/666
2012/0074586 A1* 3/2012 Seo ........................ H01L 25/16 257/774
2012/0168917 A1* 7/2012 Yim .................. H01L 23/49816 257/666
2012/0211885 A1* 8/2012 Choi ................... H01L 23/3128 257/737
2013/0026468 A1 1/2013 Yoshimuta et al.
2013/0062760 A1 3/2013 Hung et al.
2013/0062761 A1 3/2013 Lin et al.
2013/0168848 A1 7/2013 Lin et al.
2013/0307140 A1 11/2013 Huang et al.
2014/0203429 A1 7/2014 Yu et al.
2014/0225222 A1 8/2014 Yu et al.
2014/0252646 A1 9/2014 Hung et al.
2014/0264930 A1 9/2014 Yu et al.
2015/0145140 A1* 5/2015 Haba ................... H01L 21/6835 257/774
2015/0228591 A1* 8/2015 Kim ........................ H01L 24/17 257/692
2015/0235995 A1* 8/2015 Park .................... H01L 23/3128 257/773
2015/0279431 A1* 10/2015 Li ........................... H01L 25/50 365/51
2015/0279828 A1* 10/2015 Koopmans ............. H01L 25/18 257/713
2016/0049349 A1* 2/2016 Lane ...................... H01L 24/19 257/777
2016/0079205 A1* 3/2016 Lin .................... H01L 21/4853 257/737
2016/0300815 A1* 10/2016 Kim .................... H01L 25/0657

* cited by examiner

INTEGRATED FAN-OUT PACKAGE ON PACKAGE STRUCTURE AND METHODS OF FORMING SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers or dies may be bonded together through suitable bonding techniques. The stacked semiconductor devices may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
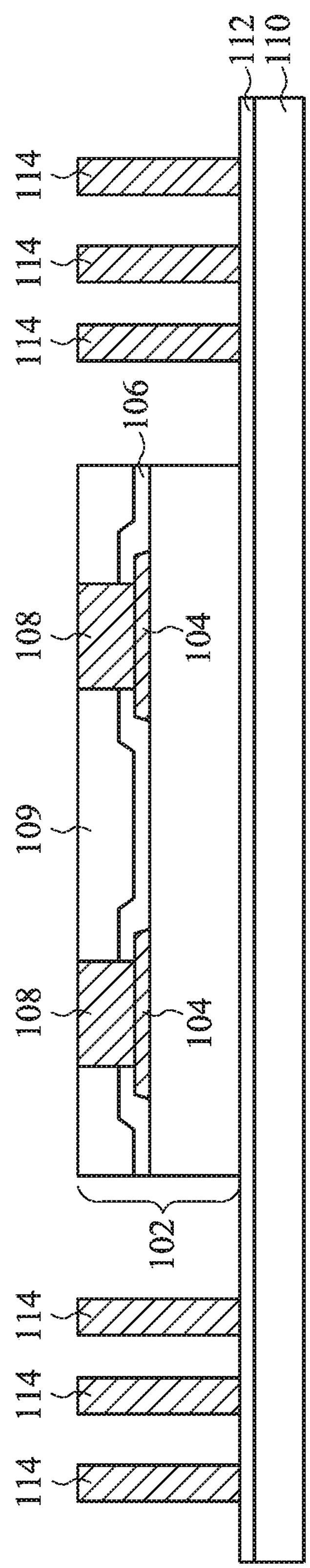
FIGS. 1 though 5A and 5B illustrate cross-sectional views of various intermediary stages of forming a semiconductor device package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include a package on package (PoP) structure having at least two bonded device packages. A top one of device packages includes a first semiconductor die with a thermal interfacing material (TIM) on a back surface of the first semiconductor die. A bottom one of the device packages is bonded to the top device package, and the TIM may also form an interface with the bottom device package. For example, the TIM may contact a second semiconductor die in the bottom device package. Thus, heat from the bottom package may be advantageously dissipated to the top package and, for example, to a heat spreader disposed on an opposing surface of the top package as the bottom package. Thus, thermal performance and reliability in an embodiment package may be improved. The heat spreader may further improve the stiffness of the top package, which may advantageously reduce warpage.

FIGS. 1 through 5B illustrates various cross-sectional views of forming a device package 100 according to some embodiments. Referring first to FIG. 1, a cross-sectional view of a semiconductor die 102 is provided. Die 102 may include a semiconductor substrate, active devices, and an interconnect structure (not individually illustrated). The substrate may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices such as transistors, capacitors, resistors, diodes, photo-diodes, fuses, and the like may be formed at the top surface of the substrate. An interconnect structure may be formed over the active devices and the substrate. The interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMDs may include low-k dielectric materials having k values, for example, lower than about 4.0 or even 2.0 disposed between such conductive features. In some embodiments, the ILD and IMDs may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). The interconnect structure electrically connect various active devices to form functional circuits within die 102. The functions provided by such circuits may include memory structures, processing structures, sensors, amplifiers, power distribution, input/output circuitry, or the like. One of ordinary skill in the art will appreciate that the above examples are provided for illustrative purposes only to further explain applications of various embodiments and are not meant to limit these embodiments in any manner. Other circuitry may be used as appropriate for a given application.

Input/output (I/O) and passivation features may be formed over the interconnect structure. For example, contact pads 104 may be formed over the interconnect structure and may be electrically connected to the active devices through the various conductive features in the interconnect structure. Contact pads 104 may comprise a conductive material such as aluminum, copper, and the like. Furthermore, a passivation layer 106 may be formed over the interconnect structure and the contact pads. In some embodiments, passivation layer 106 may be formed of non-organic materials such as silicon oxide, un-doped silicate glass, silicon oxynitride, and the like. Other suitable passivation materials may also be used. Portions of passivation layer 106 may cover edge portions of the contact pads 104.

Additional interconnect features, such as additional passivation layers, conductive pillars, and/or under bump metallurgy (UBM) layers, may also be optionally formed over contact pads 104. For example, as illustrated by FIG. 1, conductive pillars 108 may be formed on and electrically connect to contact pads 104, and a dielectric layer 109 may be formed around such conductive pillars 108.

The various features of die 102 may be formed by any suitable method and are not described in further detail herein. Although referred to as a die herein, one or more features of die 102 may be formed while die 102 is part of a larger substrate, for example, a wafer (not illustrated). After formation, die 102 may be singulated from other structures (e.g., other dies) in the wafer. Furthermore, the general features and configuration of die 102 described above are but one example embodiment, and die 102 may include any combination of any number of the above features as well as other features.

As further illustrated by FIG. 1, die 102 is attached to a carrier 110 by a die attach film (DAF) 112. Carrier 110 may be a glass or ceramic carrier and may provide temporary mechanical and structural support to die 102 during subsequent processing steps. In this manner, damage to the die 102 is reduced or prevented. In an embodiment, DAF 112 may be any suitable adhesive, such as an ultraviolet (UV) glue, which loses its adhesive property when exposed to UV lights.

Furthermore, TIVs 114 may be formed over carrier 110 prior to the attachment of die 102. TIVs 114 may comprise copper, nickel, silver, gold, and the like for example, and may be formed by any suitable process. For example, a seed layer (not shown) may be formed over carrier 110, and a patterned photoresist (not shown) having openings may be used to define the shape of TIVs 114. The openings may expose the seed layer, and the openings may be filled with a conductive material (e.g., in an electro-chemical plating process, electroless plating process, and the like). Subsequently, the photoresist may be removed in an ashing and/or wet strip process, leaving TIVs 114 over carrier 110. TIVs 114 can also be formed using copper wire stud by copper wire bond processes (e.g., where mask, photoresist, and copper plating are not required). Excess portions of the seed lay may then be removed using a combination of photolithography and/or etching, for example.

Figure 2:
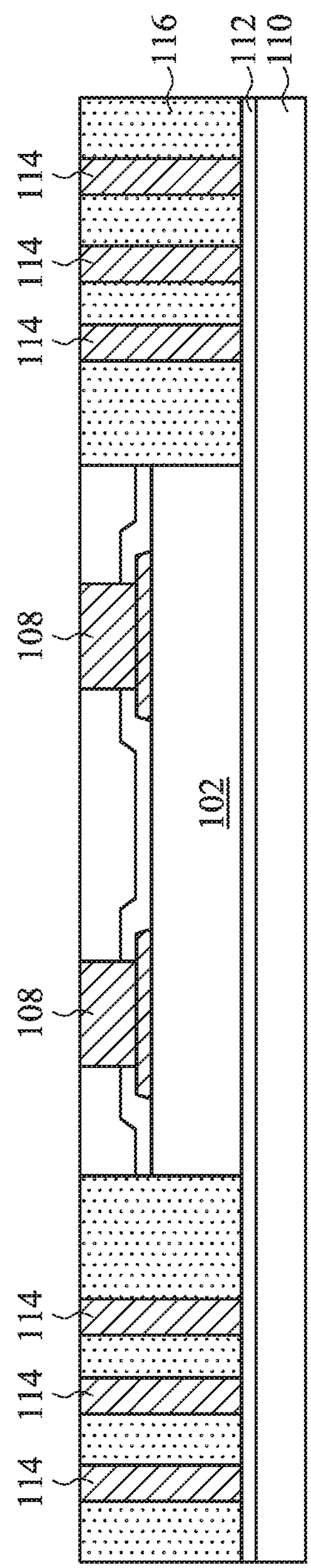

Subsequently, in FIG. 2, a molding compound 116 is formed around die 102 and TIVs 114. In embodiments molding compound 116 comprises an epoxy, a resin, a moldable polymer such as PBO, a molded underfill (MUF), or another moldable material. In some embodiments, molding compound 116 may be shaped or molded using for example, a mold (not shown), which may have a border or other feature for retaining molding compound 116 when applied. Such a mold may be used to pressure mold molding compound 116 around die 102 and TIVs 114 to force molding compound 116 into openings and recesses, eliminating air pockets or the like in molding compound 116. Subsequently, a curing process is performed to solidify molding compound 116. Other suitable processes, such as transfer molding, compressive molding, liquid encapsulent molding, and the like, may be used to form molding compound 116.

After molding compound 116 is formed around die 102, molding compound 116 is reduced or planarized by, for example, grinding, CMP, etching, or another process. In some embodiments, molding compound 116 is reduced so that I/O structures of die 102 (e.g., conductive pillars 108) are exposed. The planarization may further result in top surfaces of dies 102 being substantially level with TIVs 114 and molding compound 116.

Figure 3:
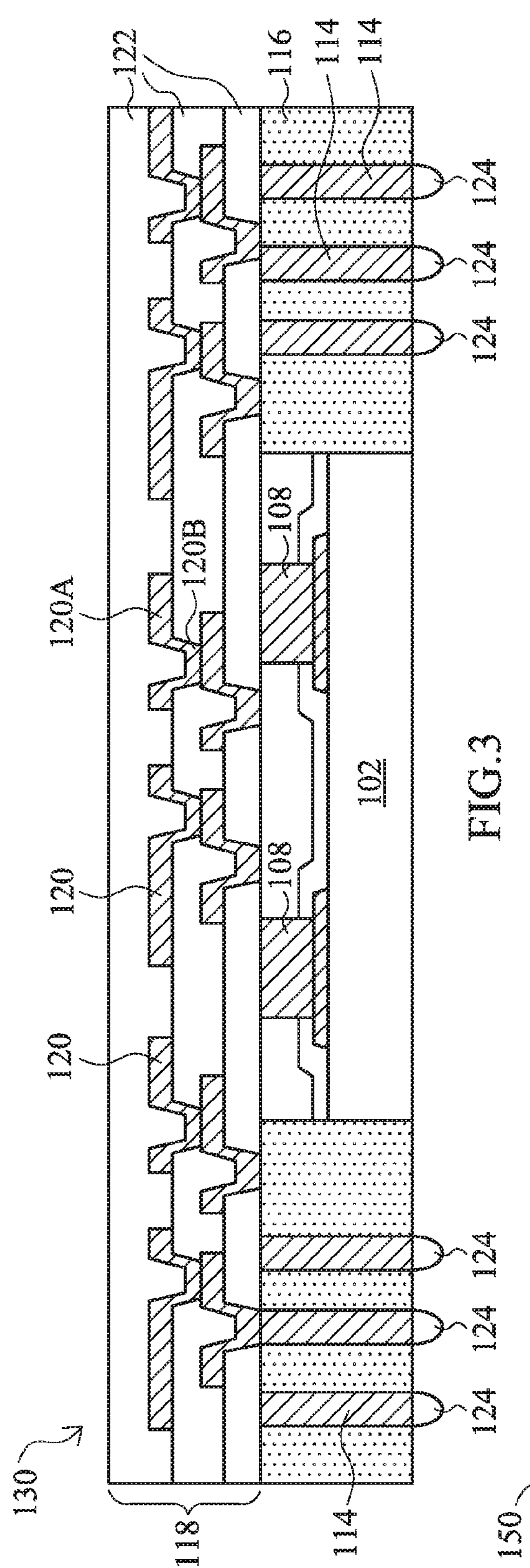

FIG. 3 illustrates the formation of RDLs 118 over molding compound 116, die 102, and TIVs 114. RDLs 118 may extend laterally past edges of die 102 over a top surface of molding compound 116. RDLs 118 may include conductive features 120 formed in one or more polymer layers 122. Polymer layers 122 may be formed of any suitable material (e.g., polyimide (PI), polybenzoxazole (PBO), benzocyclobuten (BCB), epoxy, silicone, acrylates, nano-filled pheno resin, siloxane, a fluorinated polymer, polynorbornene, and the like) using any suitable method, such as, a spin-on coating technique, lamination, and the like.

Conductive features 120 (e.g., conductive lines 120A and/or vias 120B) may be formed in polymer layers 122 and electrically connect to TIVs 114 as well as conductive pillars 108 of die 102. The formation of conductive features 120 may include patterning polymer layers 122 (e.g., using a combination of photolithography and etching processes) and forming conductive features over and in the patterned polymer layer. The formation of conductive features 120 may include depositing a seed layer (not shown), using a mask layer (not shown) having various openings to define the shape of conductive features 120, and filling the openings in the mask layer using an electro-chemical plating process, for example. The mask layer and excess portions of the seed layer may then be removed. Thus, RDLs 118 are formed over die 102, TIVs 114, and molding compound 116. The number of polymer layers and conductive features of RDLs 118 is not limited to the illustrated embodiment of FIG. 3.

For example, RDLs 118 may include any number of stacked, electrically connected conductive features in multiple polymer layers.

As further illustrated by FIG. 3, carrier 110 and DAF 112 may be removed (e.g., after RDLs 118 are formed), and solder caps 124 may be formed on an opposing side of TIVs 114 as RDLs 118. Solder caps 124 may be electrically connected to die 102 by TIVs 114 and RDLs 118. Thus, a first device package 130 is formed. In subsequent process steps, solder caps 124 may be used to bond device package 130 to other package features, such as another package in order to form an embodiment PoP structure (e.g., see FIG. 5A).

Figure 4:
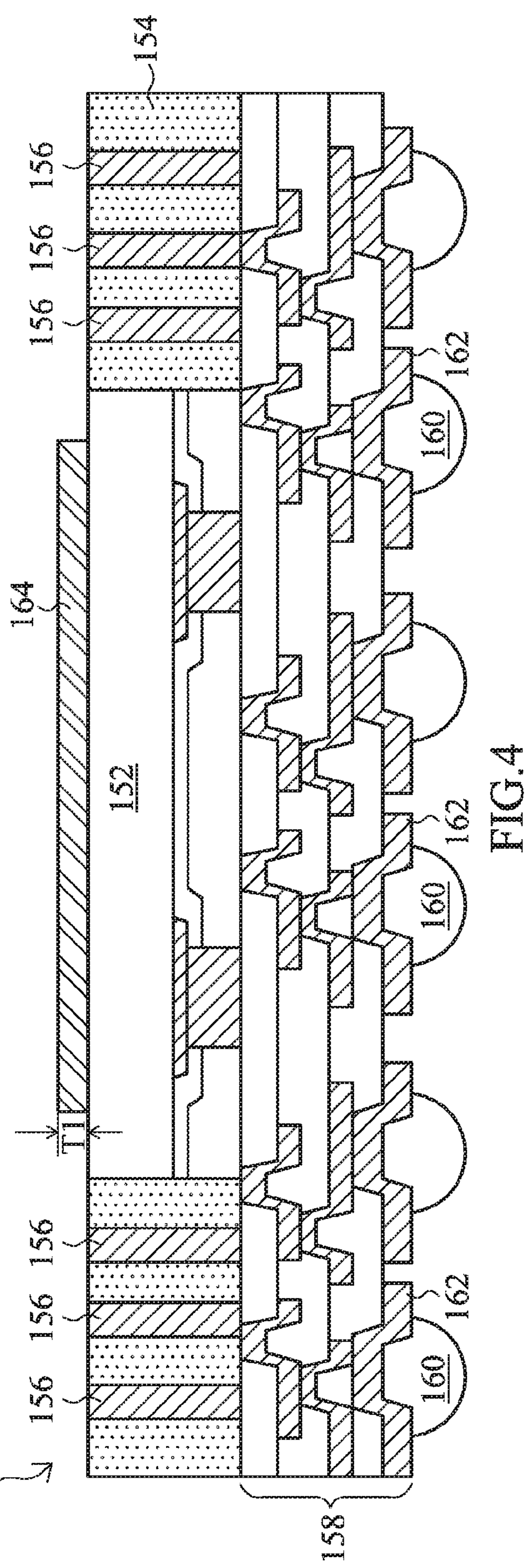

FIG. 4 illustrates a cross-sectional view of a second device package 150, which may be subsequently bonded to device package 130 in accordance with some embodiments (e.g., see FIG. 5A). In an embodiment, device package 150 includes similar features as device package 130. For example, device package 150 may include a die 152 and a molding compound 154 formed around and extending along sidewalls of die 152. Die 152 may comprise similar features as die 102, and die 152 may or may not provide a same functionality as die 102. For example, in an embodiment, die 102 may be a memory die while die 152 may be a logic die providing control circuitry. Other embodiments may include dies providing different functionality. Package 150 may further include TIVs 156 extending through molding compound 154 and RDLs 158 formed over die 102, molding compound 154, and TIVs 156.

Device package 150 may further include additional features, such as external connectors 160 (e.g., BGA balls, C4 bumps, and the like) formed over RDLs 158. Connectors 160 may be disposed on UBMs 162, which may also be formed over RDLs 158. Connectors 160 may be electrically connected to die 152 and TIVs 156 by way of RDLs 158. Connectors 160 may be used to electrically connect device package 150 (and subsequently device package 100, see FIG. 5A) to other package components such as another device die, interposers, package substrates, printed circuit boards, a mother board, and the like.

As further illustrated by FIG. 4, a TIM 164 may be formed (e.g., dispensed) on an opposing side of device package 150 as RDLs 158. For example, TIM 164 may be formed on a surface of device package 150 to be bonded to device package 130 (see FIG. 5A). TIM 164 may comprise any suitable material, such as a polymer having a good thermal conductivity, which may be between about 3 watts per meter kelvin (W/m·K) to about 5 W/m·K or more. In an embodiment, TIM 164 may comprise an adhesive-type material, a gel-type material, or a combination thereof, such as a material provided by ShinETSU Silicones or Dow Corning. As explained in greater detail below, TIM 164 may advantageously improve heat dissipation in the resulting bonded device package 100 by providing a heat dissipation path from device package 150 through device package 130.

Figure 5A:
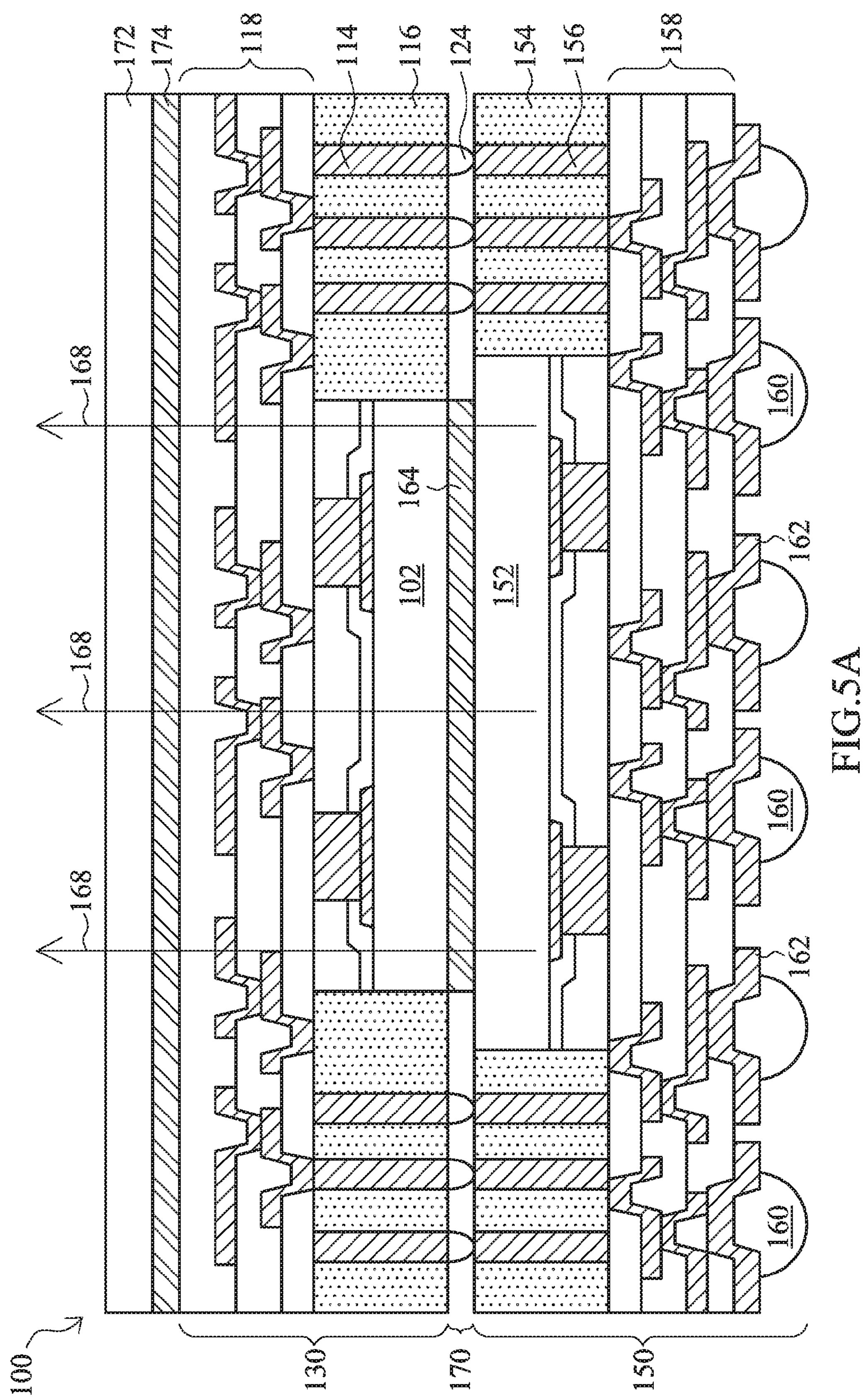
Figure 5B:
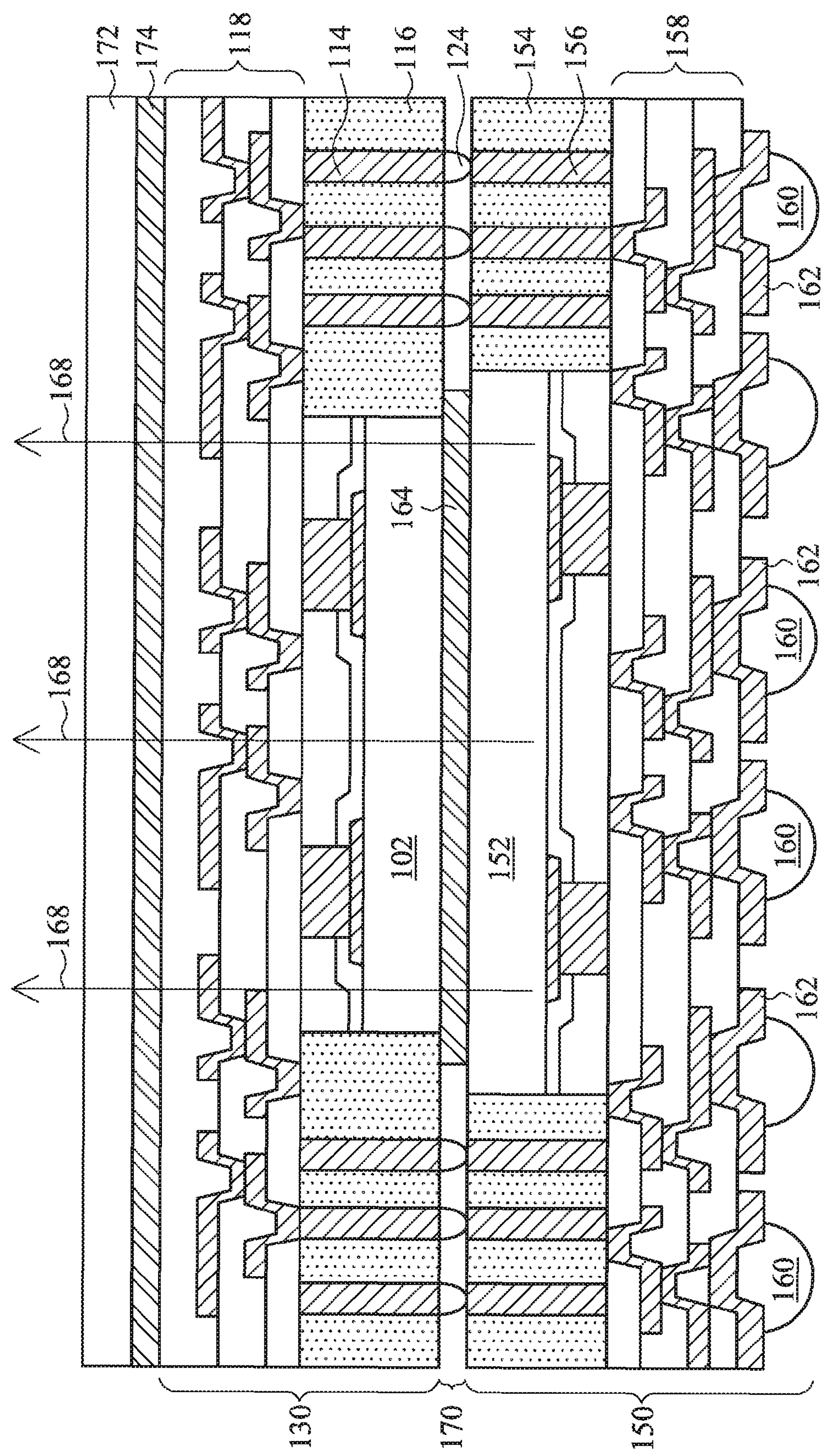

FIG. 5A illustrates a bonded device package 100 comprising device package 130 bonded to device package 150. Packages 130 and 150 may be bonded, for example, by aligning and bonding solder caps 124 of package 130 with TIVs 156 of package 150. Die 152 may be electrically connected to die 102 by RDLs 158, TIVs 164, TIVs 114, and RDLs 118. During bonding, TIM 164 may be disposed between and contact both device packages 130 and 150. Device package 130 (e.g., die 102) may apply pressure onto TIM 164 during, which may cause TIM 164 to spread laterally. In some embodiments, a reflow process is used to bond solder caps 124 to TIVs 156, which may further cure TIM 164. Heat from device package 150 may be dissipated through die 102 of device package 130 as illustrated by arrows 168.

TIM 164 may bridge a gap 170 between device packages 130 and 150, and TIM 164 may be formed to have a thickness T1 (e.g., measured between top and bottom surfaces of TIM 164) that is sufficiently large to bridge gap 170. For example, in some embodiments, thickness T1 of TIM 164 may be about 10 μm to about 50 μm. Furthermore, in a top down view (not shown), TIM 164 may cover a relatively large percentage of a bottom surface of die 102. For example, a surface area of TIM 164 may be at least about 80% of a surface of area of a bottom surface of die 102. It has been observed that when TIM 164 has a surface area in this range, thermal performance may be advantageously improved in the device package. For example, thermal performance in package 100 may include improved efficiency and lowered thermal resistance by providing an additional thermal dissipation path through die 102. In some embodiments, a surface area of TIM 164 may be larger than a surface area of die 102, and TIM 164 may extend laterally past edges of die 102 to contact molding compound 116 (see e.g., FIG. 5B). In other embodiments, TIM 164 may only partially cover a bottom surface of die 102. For example, TIM 164 may be localized and disposed only on hot spots (or other selective areas) of die 102 and/or bottom package 150 (e.g., hot spots on die 152) depending on package design.

A heat spreader 172 may be attached to an opposing side of device package 130 as device package 150 to further improve heat dissipation in device package 100. For example, heat spreader 172 may disperse heat transmitted from dies 102 and 152. In some embodiments, heat spreader 172 has a high thermal conductivity, for example, between about 200 W/m·K to about 400 W/m·K or more, and may be formed using a metal, a metal alloy, or the like. For example, heat spreader 172 may comprise metals and/or metal alloys such as Al, Cu, Ni, Co, combinations thereof, and the like. A second TIM 174 may attach heat spreader 170 to device package 150. Heat spreader 172 may increase the rigidity of device package 150, which advantageously reduces warpage in package 100. Thus, an embodiment PoP includes thermal management features that advantageously reduces warpage and improves thermal dissipation. Additional features may also be bonded to package 100. For example, another device die, interposers, package substrates, printed circuit boards, a mother board, and the like (not shown) may be bonded to package 100 by connectors 160.

Figure 6:
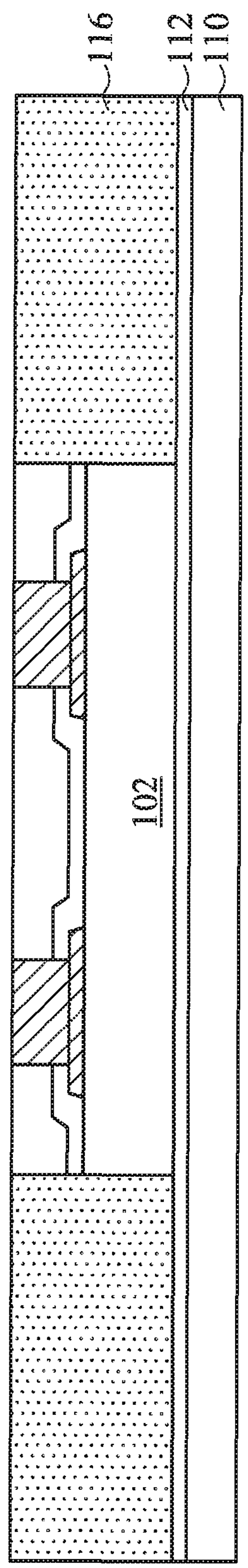
FIGS. 6 through 10 illustrate cross-sectional views of various intermediary stages of forming a semiconductor device package in accordance with some other embodiments.

FIGS. 6 through 10 illustrate cross-sectional views of intermediary stages of manufacturing a device package 200 in accordance with some alternative embodiments. Package 200 may be similar to package 100 where like references numerals indicate like elements. Referring to FIG. 6, a semiconductor die 102 is attached to a carrier substrate 110 by a DAF 112. A molding compound 116 is formed around and extending along sidewalls of die 102. Top surfaces of molding compound 116 and die 102 may be substantially level.

Figure 7:
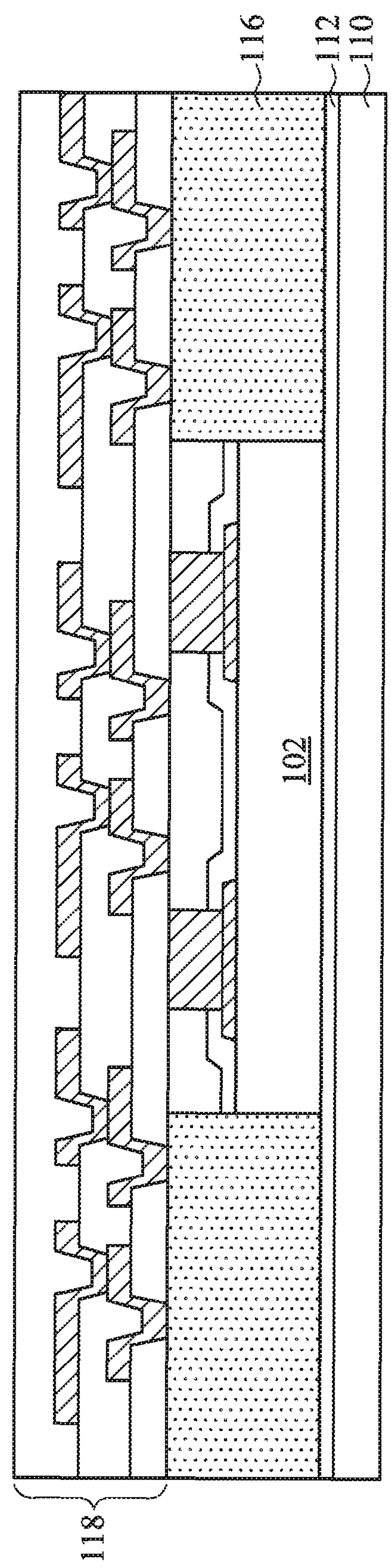

In FIG. 7, fan-out RDLs 118 are formed over die 102 and molding compound 116. RDLs 118 maybe electrically connected to die 102, and RDLs may extend laterally past die 102 onto molding compound 116. RDLs 118 include various conductive features 120 formed in one or more polymer layers 122. After RDLs 118 are formed, carrier 110 and DAF 112 may be removed as illustrated by FIG. 8.

Figure 8:
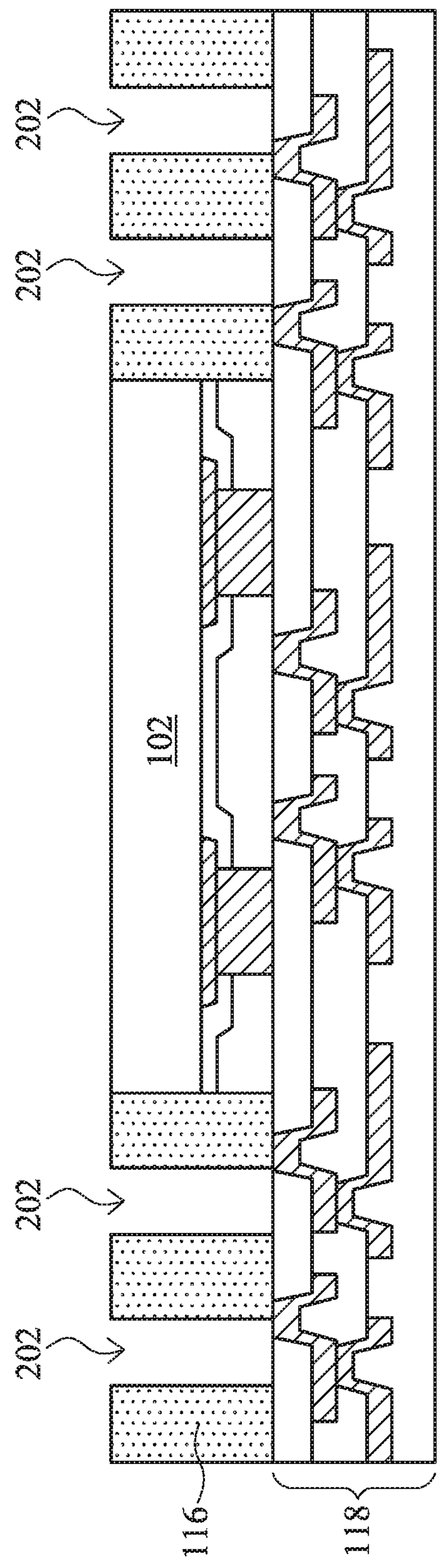
Figure 9:
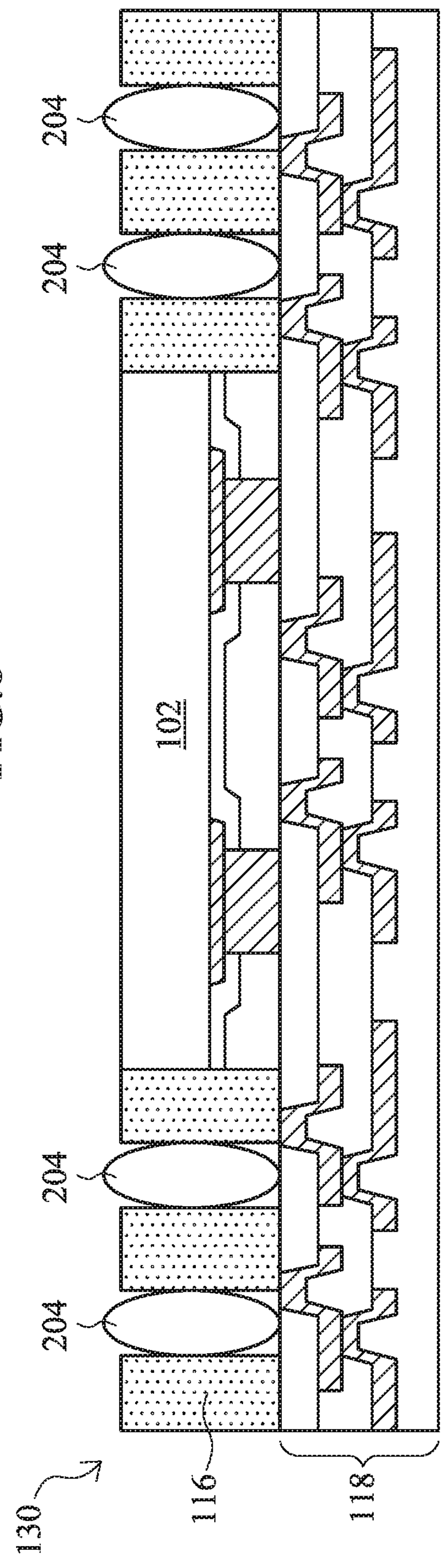

As further illustrated by FIG. 8, openings 202 may be patterned in molding compound 116 using a laser ablation process, for example. Openings 202 may extend through molding compound 116 to expose conductive features (not explicitly illustrated in FIG. 8) in RDLs 118. Next, in FIG. 9, solder balls 204 are formed in openings 202 using a ball drop process, for example. Solder balls 204 may extend through molding compound 116, and a portion of solder balls 204 may further extend past a top surface of molding compound 116. Thus, a first package 130 is formed according to some embodiments.

Figure 10:
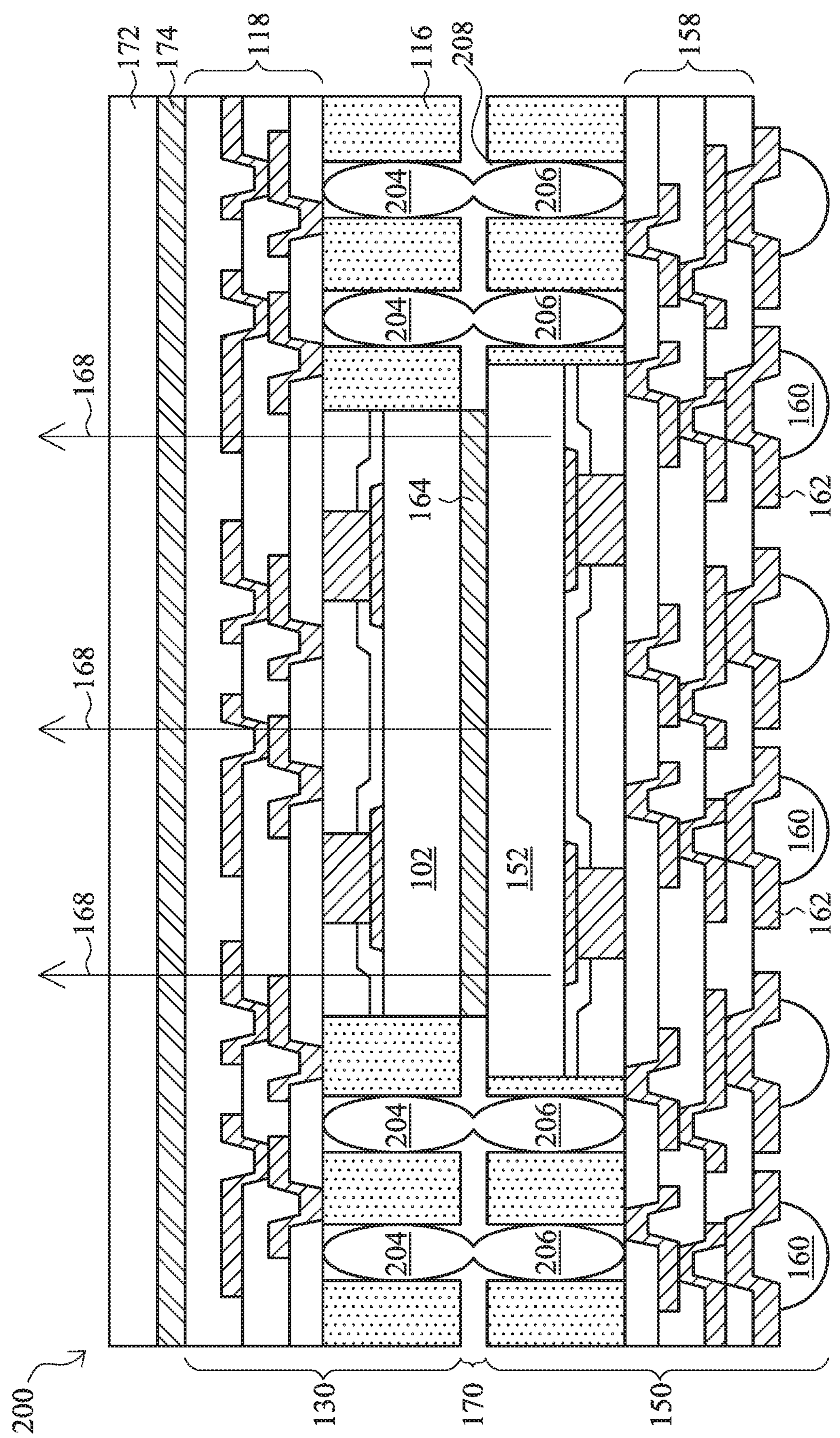

FIG. 10 illustrates package 130 bonded to a bottom package 150. Bottom package 150 may include a die 152, a molding compound 154 around die 152, RDLs 158 electrically connected to die 152, and external connectors (e.g., UBMs 162/connectors 160. Bottom package 150 may further include solder balls 206 disposed in openings 208, which extend through molding compound 154. Solder balls 206 may be bonded to solder balls 204 in package 150. For example, solder balls 204 and 206 may be aligned, contacted, and reflowed in order to bond packages 130 and 150. Thus various features (e.g., dies 102 and 152 as well as RDLs 118 and 158) in packages 130 and 150 may be electrically connected. In other embodiments, bottom package 150 may include a different configuration.

A TIM 164 may be span a gap 170 between packages 130 and 150. For example, TIM 164 may contact a bottom surface of die 102 as well as a top surface of package 150 (e.g., die 152). Thus, TIM 164 may provide a heat dissipation path to from bottom package 150 through top package 130 as indicated by arrows 168. A heat spreader 172 may further be attached to a surface of package 130 opposing TIM 164. Thus, thermal performance may be improved in package 200. Furthermore, heat spreader 172 may advantageously reduce warpage in package 200.

Figure 11:
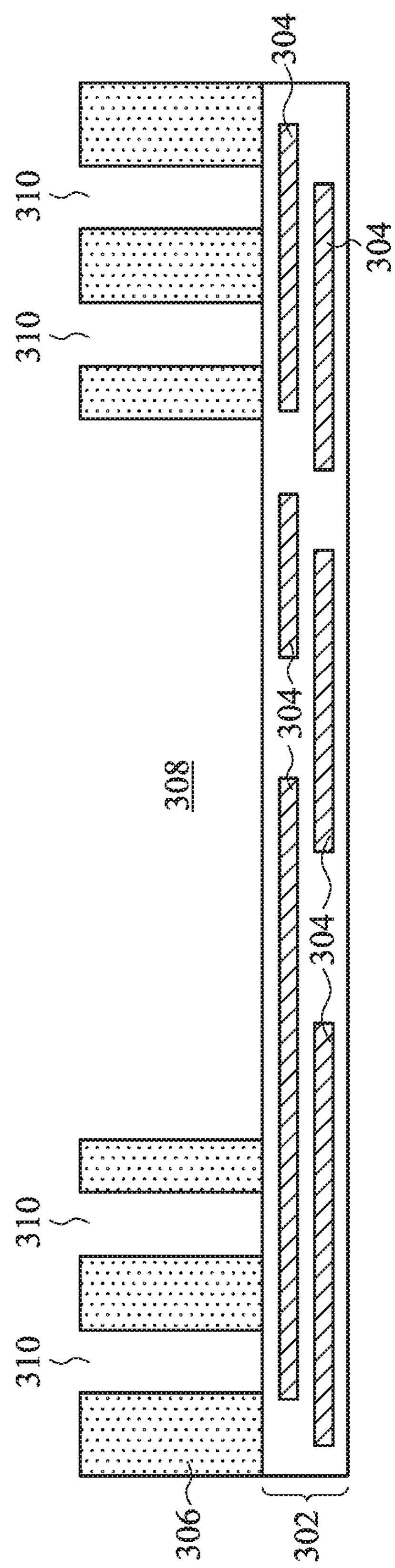
FIGS. 11 through 13 illustrate cross-sectional views of various intermediary stages of forming a semiconductor device package in accordance with some other embodiments.
Figure 12:
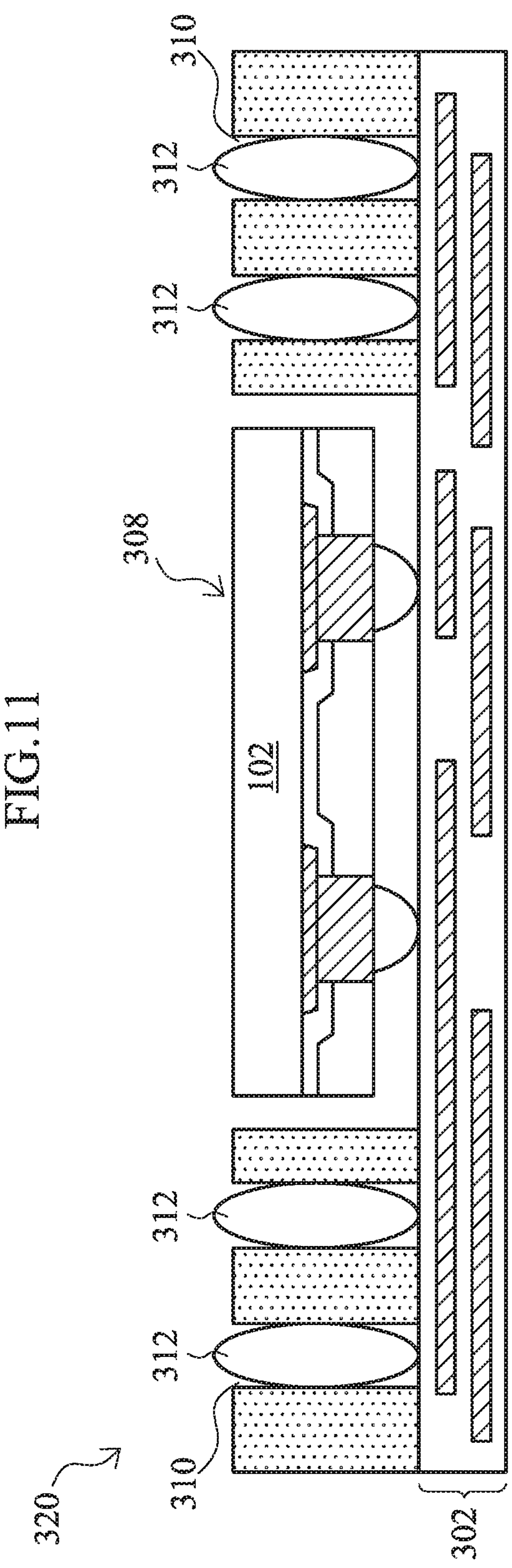
Figure 13:
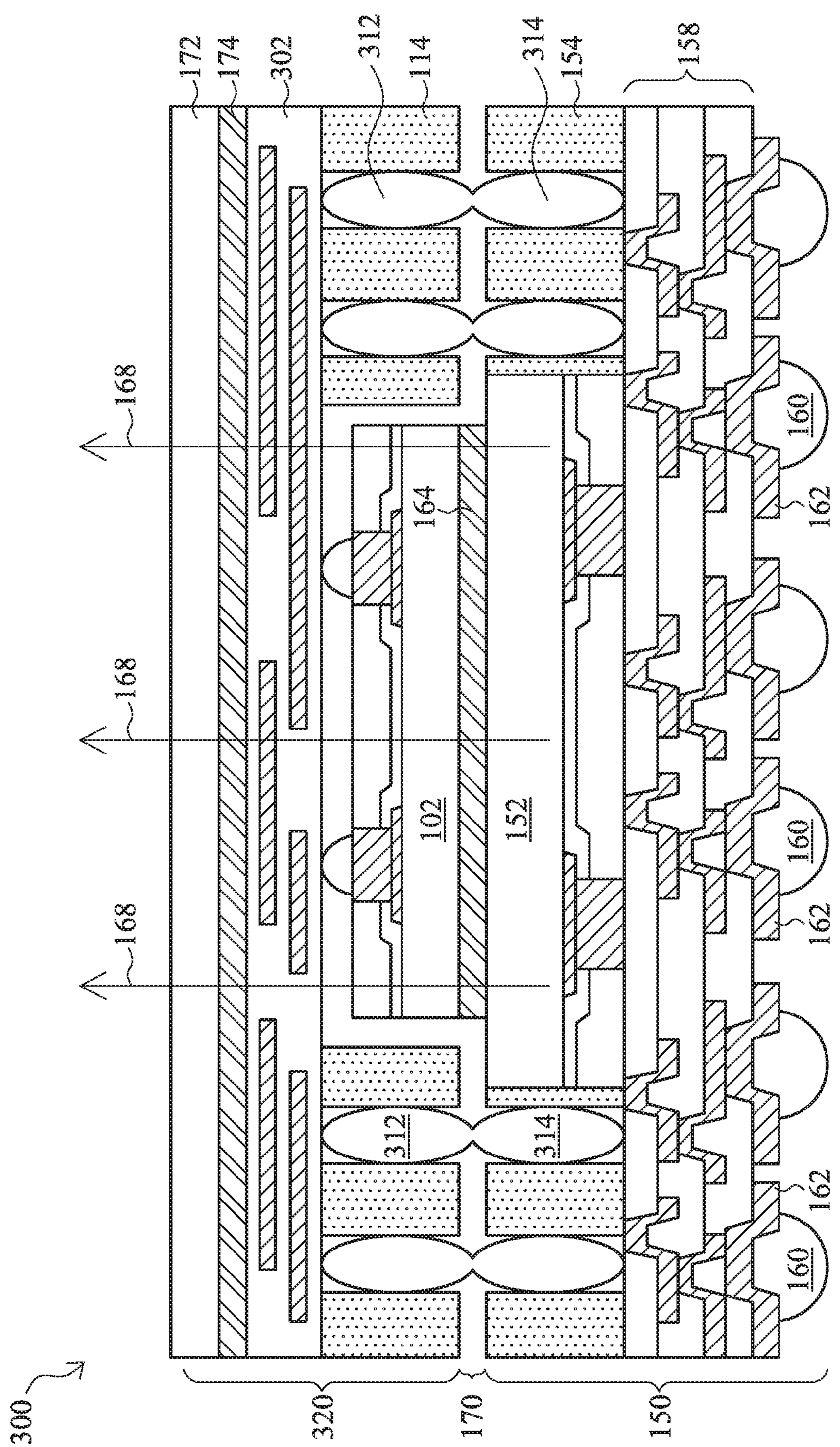

FIGS. 11 through 13 illustrate cross-sectional views of intermediary stages of manufacturing a package 300 in accordance with some other embodiments. Package 300 may be similar to package 100 where like references numerals indicate like elements. Referring first to FIG. 11, a substrate 302 having conductive features 304 disposed therein. In an embodiment, conductive features 304 may be formed in one or more dielectric layers, which may include low-k dielectric materials. In another embodiments, substrate 302 is a package substrate, and conductive features 304 may be formed in one or more build-up layers. In such embodiments, substrate 302 may further include a package core and one or more through-vias electrically connecting conductive features on opposing sides of the package core.

A molding compound 306 (or other insulating material) may be formed over package substrate 302. Furthermore, molding compound 306 may include a cavity 308 and one or more openings 310. Openings 310 and cavity 308 may extend through molding compound 306 to expose conductive features (not shown) on package substrate 302. Openings 310 and cavity 308 may be patterned in molding compound 306, for example, by laser drilling, photolithography, and/or other etching processes.

After openings 310 and cavity 308 are patterned, solder balls 312 may be disposed in openings 310 as illustrated by FIG. 12. For example, a ball drop process may be used to disposed solder balls 312 in openings 310. As further illustrated by FIG. 12, die 102 may be at least partially disposed in cavity 308 and flip chip bonded to package substrate 302. For example, die 102 may include external connectors 312, which may be solder bumps, such as C4 bumps, microbumps, BGA balls, and the like. In various embodiments, cavity 308 may be patterned to have a sufficiently large surface area in order to accommodate die 302. For example, a lateral dimension of cavity 308 may be larger than a lateral dimension of die 302. Thus, a top package 320 may be formed. In other embodiments, top package 320 may include TIVs (e.g., similar to TIVs 114) with solder caps (e.g., similar to solder caps 124) in lieu of or in addition to solder balls 312 in openings 310.

FIG. 13 illustrates package 320 bonded to a bottom package 150. Bottom package 150 may include a die 152, a molding compound 154 around die 152, RDLs 158 electrically connected to die 152, and external connectors (e.g., UBMs 162/connectors 160. Bottom package 150 may further include solder balls 314 in openings 316 extending through molding compound 154. Solder balls 314 may be bonded to solder balls 312 in package 320. For example, solder balls 314 and 312 may be aligned, contacted, and reflowed in order to bond packages 320 and 150. Thus various features (e.g., die 102, package substrate 302, die 152, and RDLs 118) in packages 130 and 150 may be electrically connected. In other embodiments, bottom package 150 may include a different configuration.

A TIM 164 may be bridge a gap 170 between packages 320 and 150. For example, TIM 164 may contact a bottom surface of die 102 as well as a top surface of package 150, Thus, TIM 164 may provide a heat dissipation path to disperse heat from bottom package 150 through top package 320 as indicated by arrows 168. A heat spreader 172 may further be attached to a surface of package 320 opposing TIM 164. Thus, thermal performance may be improved in package 300. Furthermore, heat spreader 172 may advantageously reduce warpage in package 300.

Figure 14:
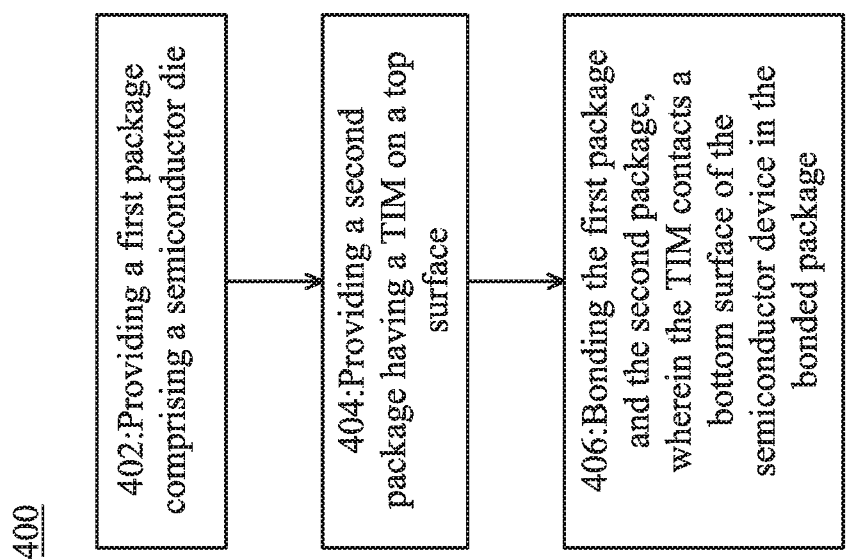
FIG. 14 illustrates a process flow for forming a semiconductor device package in accordance with some embodiments.

FIG. 14 illustrates a process flow 400 for forming a device package in accordance with some embodiments. In step 402, a first package is provided. The first package may include a semiconductor die (e.g., die 102) having a back surface exposed. Throughout the description a back surface may be used to describe a surface of a die or substrate opposing a side of the substrate having active devices and functional circuits formed thereon. Next in step 404, a bottom package (e.g., package 150) is provided. A TIM (e.g., TIM 164) may be disposed on a top surface of the bottom package. In step 406, the top and bottom packages are bonded together so that the TIM contacts a bottom surface of the semiconductor die. The TIM may provide a thermal dissipation path from the bottom package through the top package. Additional features may also be attached to the package. For example, a heat spreader (e.g., heat spreader 172) may be attached to an opposing side of the top package as the bottom package.

Various embodiments include a device package having at least two bonded device packages with a TIM disposed between the two packages. The TIM may contact a bottom surface of a semiconductor die in a top one of the device packages. Heat from the bottom package may be advantageously dissipated to the top package and, for example, to a heat spreader over the top package. Thus, thermal performance and reliability in an embodiment package may be improved. The heat spreader may further improve the stiffness of the top package, which may advantageously reduce warpage.

In accordance with an embodiment, a package includes a first package; a thermal interface material (TIM) contacting a top surface of the first package, and a second package bonded to the first package. The second package includes a first semiconductor die, and the TIM contacts a bottom surface of the first semiconductor die. The package further includes a heat spreader disposed on an opposing surface of the second package as the first package.

In accordance with another embodiment, a package includes a first die, a first molding compound extending along sidewalls of the first die, a polymer layer on a top surface of the first die, and a second die over and separated from the first die by a gap. The polymer layer spans the gap and contacts a bottom surface of the second die. The package further includes a second molding compound extending along sidewalls of the second die and a heat spreader over the second die. The first molding compound and the second molding compound are separated by the gap.

In accordance with yet another embodiment, a method includes providing a first package having a first semiconductor die, providing a second package having a thermal interface material (TIM) on a top surface, and bonding the first package to the second package to form a bonded package. The TIM contacts a bottom surface of the first semiconductor die in the bonded package. The method further includes attaching a heat spreader to an opposing side of the first package as the TIM.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:

a first package comprising a first semiconductor die, wherein the first semiconductor die comprises a first semiconductor substrate;

a thermal interface material (TIM) at least partially contacting a top surface of the first package;

a second package bonded to the first package, wherein the second package comprises a second semiconductor die, wherein the second semiconductor die comprises a second semiconductor substrate, wherein the TIM at least parially contacts a first surface of the first semiconductor substrate and a second surface of the second semiconductor substrate, wherein the TIM has a same material composition throughout, and wherein the TIM extends continuously throughout an area bounded by a first line extending from a first sidewall of the first semiconductor substrate to the second semiconductor substrate, a second line extending from a second sidewall of the first semiconductor substrate to the second semiconductor substrate, the first surface of the first semiconductor substrate, and the second surface of the second semiconductor substrate, and wherein the TIM extends laterally past edges of the second semiconductor die along a surface of the second package; and a heat spreader disposed on an opposing surface of the second package as the first package.

2. The package of claim 1, wherein in a first surface area of the TIM is at least about eighty percent of a second surface area of the second semiconductor die.

3. The package of claim 1, wherein the second package further comprises:

a molding compound around the second semiconductor die;

a plurality of through-vias extending through the molding compound; and solder caps on each of the plurality of through-vias.

4. The package of claim 1, wherein the second package further comprises:

a molding compound around the second semiconductor die;

a plurality of openings extending through the molding compound; and a solder ball at least partially disposed in each of the plurality of openings.

5. The package of claim 1 further comprising fan-out redistribution layers (RDLs) disposed on an opposing side of the first semiconductor die as the TIM, wherein the fan-out RDLs extend laterally past edges of the second semiconductor die.

6. The package of claim 1 further comprising a substrate on an opposing side of the second semiconductor die as the TIM, wherein the second semiconductor die is flip chip bonded to the substrate.

7. A package comprising:

a first die comprising a first input/output feature disposed on a first semiconductor substrate, wherein the first die comprises a top surface disposed on an opposing side of the first semiconductor substrate as the first input/output feature;

a first molding compound extending along sidewalls of the first die;

a polymer layer at least partially contacting the top surface of the first die;

a second die over and separated from the first die by a gap, wherein the second die comprises a second input/output feature disposed on a second semiconductor substrate, wherein the polymer layer spans the gap and contacts a bottom surface of the second die, and wherein the bottom surface of the second die is disposed on an opposing side of the second semiconductor substrate as the second input/output feature; and a second molding compound extending along sidewalls of the second die, wherein the first molding compound and the second molding compound are separated by the gap, wherein the gap comprises an air gap, the air gap being between a top surface and a bottom surface of the first and second molding compounds respectively.

8. The package of claim 7, wherein the polymer layer contacts a bottom surface of the second molding compound.

9. The package of claim 7 further comprising:

a heat dissipation feature over the second die;

through inter-vias (TIVs) extending through the second molding compound;

solder caps on the TIVs, wherein the solder caps are disposed in the gap; and conductive elements extending through the first molding compound and bonded to the solder caps.

10. The package of claim 7 further comprising: openings extending through the second molding compound; and solder balls disposed in the openings and gap, wherein the solder balls are bonded to conductive elements in the first molding compound.

11. The package of claim 7 further comprising fan-out redistribution layers (RDLs) between the second die and a heat spreader over the second die.

12. The package of claim 7, wherein the second die is flip chip bonded to a package substrate, wherein the package substrate is disposed between the second die and a heat spreader over the second die.

13. The package of claim 12, wherein the second die is disposed in a cavity in the second molding compound, wherein a lateral dimension of the second molding compound is greater than a lateral dimension of the second die.

14. The package of claim 7 , wherein the polymer layer is a thermal interface material, and wherein a first surface area of the polymer layer is at least eighty percent of a second surface area of the bottom surface of the second die.

15. A package comprising:

a first semiconductor substrate;

a first molding compound encapsulating the first semiconductor substrate, wherein a surface of the first molding compound is substantially level with a surface of the first semiconductor substrate;

a polymer layer at least partially contacting the surface of the first semiconductor substrate;

a second semiconductor substrate disposed on an opposing side of the polymer layer as the first semiconductor substrate, wherein a surface of the second semiconductor substrate contacts the polymer layer; and a second molding compound extending along a sidewall of the second semiconductor substrate, wherein a surface of the second molding compound is substantially level with the surface of the second semiconductor substrate, and wherein the surface of the first molding compound is spaced apart from the surface of the second molding compound by an air gap.

16. The package of claim 15, wherein the polymer layer contacts the surface of the second molding compound.

17. The package of claim 15, wherein the second molding compound is spaced apart from the sidewall of the second semiconductor substrate by an additional air gap.

18. The package of claim 15, further comprising:

first conductive features extending through the first molding compound and electrically connected to first redistribution layers; and second conductive features extending through the second molding compound and electrically connected to second redistribution layers, wherein the first redistribution layers and the second redistribution layers are disposed on opposing sides of the first semiconductor substrate, and wherein the second conductive features are electrically connected to the first conductive features.

* * * * *